United States Patent [19]
Frakso et al.

[11] Patent Number: 5,745,240
[45] Date of Patent: Apr. 28, 1998

[54] METHOD AND DEVICE FOR IN SITU STRESS MEASUREMENT WITHIN A THIN FILM UPON ITS DEPOSITION ON A SUBSTRATE

[75] Inventors: Fatima Frakso, Les Ponts Ce; Richard Bosmans, Noiseau; Luc Nouvelot, St Egreve, all of France

[73] Assignee: Essilor International Compagnie Generale d'Optique, Charenton Le Pont, France

[21] Appl. No.: 652,535
[22] PCT Filed: May 11, 1995
[86] PCT No.: PCT/FR95/00619
§ 371 Date: Jun. 3, 1996
§ 102(e) Date: Jun. 3, 1996
[87] PCT Pub. No.: WO95/31706
PCT Pub. Date: Nov. 23, 1995

[30] Foreign Application Priority Data

May 11, 1994 [FR] France ................. 94 05793

[51] Int. Cl.⁶ ................................................ G01B 11/06
[52] U.S. Cl. ................. 356/382; 356/381; 156/626.1
[58] Field of Search ........................... 356/72, 73, 381, 356/382, 355, 357, 345, 445; 250/560; 156/601, 612, 626, 627; 118/50, 50.1, 620–640

[56] References Cited

U.S. PATENT DOCUMENTS

| | | | |
|---|---|---|---|
| 3,383,238 | 5/1968 | Unzicker et al. | 118/50 |
| 3,570,449 | 3/1971 | Blecherman et al. | 118/9 |
| 3,800,738 | 4/1974 | Tassara | 118/8 |
| 4,024,291 | 5/1977 | Wilmanns | 427/10 |
| 4,121,537 | 10/1978 | Maruyama et al. | 118/7 |
| 4,948,259 | 8/1990 | Enke et al. | 356/382 |
| 5,154,810 | 10/1992 | Kamerling et al. | 204/192.13 |
| 5,392,124 | 2/1995 | Barbee et al. | 356/381 |
| 5,450,205 | 9/1995 | Sawin et al. | 356/382 |

FOREIGN PATENT DOCUMENTS

| | | |
|---|---|---|
| 2 344 643 | 10/1977 | France . |
| 60-229 255 | 11/1985 | Japan . |
| 63-157869 | 6/1988 | Japan . |

OTHER PUBLICATIONS

J.M.E. Harper et al., "Stress Measurement Device", *IBM Technical Disclosure Bulletin*, vol. 26, No. 7B, Dec. 1983, New York, pp. 3879–3882.

H.L. Caswell et al., "Residual Stress Measuring Instrument", *IBM Technical Disclosure Bulletin*, vol. 4, No. 7, Dec. 1961, New York, p. 63.

C.M. Su et al., "In Situ Mechanical Relaxation of CU Films Growing on a SI Substrate", *Applied Physics Letters*, vol. 63, No. 25, Dec. 1993, New York, pp. 3437–3439.

Y.S. Chen et al., "Stress Measurements on Multilevel Thin Film Dielectric Layers Used in SI Integrated Circuits", *Journal of Vacuum Science and Technology:Part A*, vol. 4, No. 3, May 1986, New York, pp. 645–649.

*Primary Examiner*—Frank G. Font
*Assistant Examiner*—Michael P. Stafira
*Attorney, Agent, or Firm*—Young & Thompson

[57] ABSTRACT

In situ stress measurement is carried out within a thin film upon its deposition on a substrate. The substrate is supported on a rotatable collective holder having a plurality of sites therefor and the thin film is deposited in the course of rotation of the collective holder. An individual holder is provided for carrying a test sample at one of a plurality of sites on the collective holder. A sensor is adapted to measure deformation of the test sample, thereby to determine the stress within the film deposited along the test sample and hence the stress within the film deposited on the substrate.

24 Claims, 3 Drawing Sheets

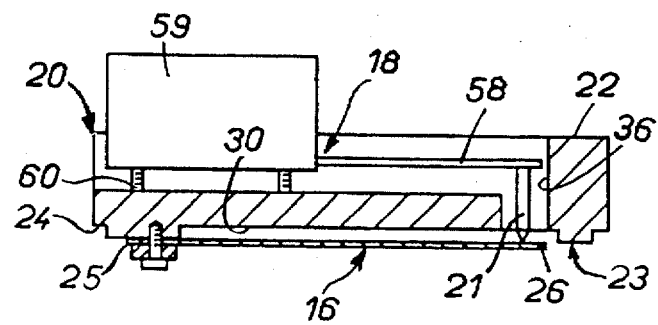
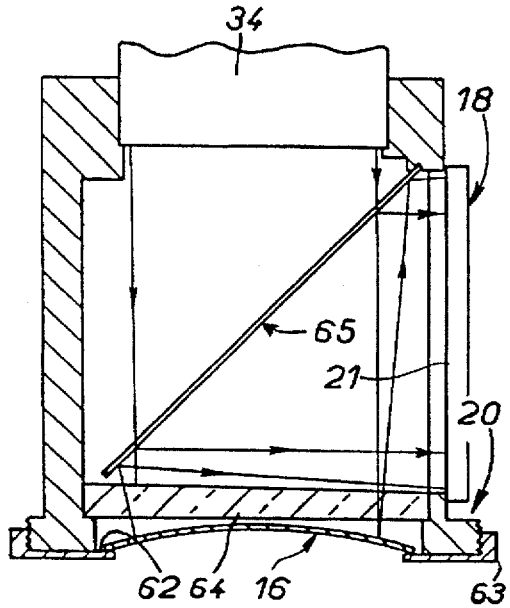
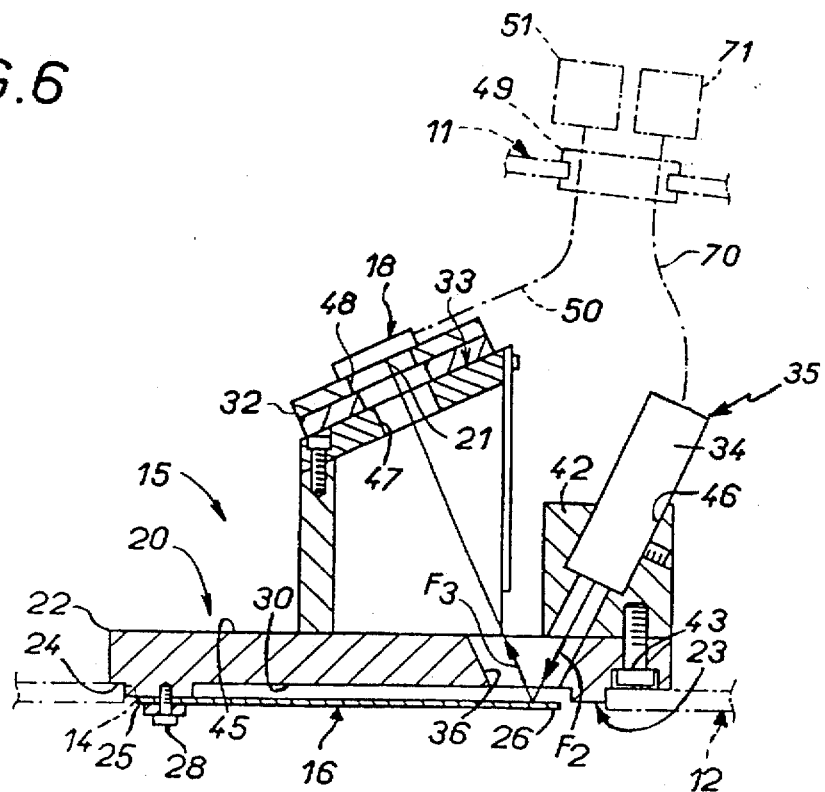

METHOD AND DEVICE FOR IN SITU STRESS MEASUREMENT WITHIN A THIN FILM UPON ITS DEPOSITION ON A SUBSTRATE

BACKGROUND OF THE INVENTION

1. Field of the Invention

The present invention is generally concerned with measuring stresses in a thin film upon its deposition on a substrate, in order to control such stresses.

It is more particularly, although not necessarily exclusively, directed to the situation in which the substrate is a lens for spectacles or, to be more precise, the blank having a generally circular peripheral contour from which a spectacle lens can subsequently be obtained by trimming.

It is well known to apply a thin film to both faces of a spectacle lens, for example to confer anti-reflection properties on it to make it less noticeable and/or to improve resistance to scratching and abrasion, especially in the case of a spectacle lens made of organic material.

The thin film is usually deposited in a vacuum, for example by evaporation, carried out by electron bombardment in an appropriate processing chamber in practise containing a collective holder in the general shape of a bell, for example, and having a plurality of sites each adapted to receive an individual spectacle lens to be processed.

Any thin film deposited onto a substrate in this way is subject to internal stresses during its deposition on the substrate which, tending to expand or to contract it relative to the latter, tend to cause it to be detached or to render it more easily detachable in the event of external aggression if the adhesion forces that conjointly hold it onto the substrate are insufficient.

The internal stresses are both thermal in nature, resulting from an inevitable difference between the coefficient of thermal expansion of the materials used during the heating and cooling phases that are inherent to the processing employed, and intrinsic in nature, resulting from a structural rearrangement of the atoms that inevitably takes place as the layer is formed.

2. Description of Related Art

A first step towards controlling these internal stresses, and thereby improving the durability of the thin layer deposited, is to measure them.

U.S. Pat. No. 5,154,810 proposes the use for this purpose of a test sample carried by the collective holder on which the substrates to be processed are placed, a light source that directs a light beam onto the test sample and a sensor, in particular an optical sensor, to be more precise a displacement sensor, onto which the light beam reflected by the sample is directed.

As a thin film is deposited onto the sample, the stresses developing in the thin film cause curvature of the test sample which in turn causes deviation of the reflected light beam.

Measured by the displacement sensor, this deviation provides an assessment of the curvature of the test sample and therefore of the internal stresses in the thin film that it is carrying.

Apart from its relative simplicity, a method of this kind has the advantage of being usable in situ, the test sample being placed in the processing chamber.

In U.S. Pat. No. 5,154,810 the light source and the displacement sensor are outside the processing chamber, however.

This means that both the incident light beam and the reflected light beam have to pass through a porthole which becomes progressively less transparent as the processing proceeds, because of the deposit that is inevitably formed on the porthole itself, and this rapidly compromises the quality of the measurement conjointly effected.

What is more, the test sample being placed on a moving collective holder, the measurement is possible only when the test sample is facing the porthole through which the measurement light beams pass.

Because of this the measurement is discontinuous and necessarily comparative.

It also uses controls on the upstream and downstream side of the test sample.

Each measurement therefore requires three operations, one on the test sample and the others on the controls, and these operations have to be synchronized with the movement of the collective support, which significantly complicates the system.

SUMMARY OF THE INVENTION

A general object of the present invention is a method and a device avoiding these drawbacks and having further advantages.

In accordance with the invention, for in situ measurement of stresses within a thin film upon its deposition on a substrate in a processing chamber containing a collective holder having a plurality if sites each adapted to receive a substrate, which method uses a test sample that is carried by the collective holder and a sensor that is adapted to measure the deformation of the test sample, the test sample is placed on an individual holder adapted to be received in one site of the collective holder instead of a substrate and which also carries at least the insertable portion of the sensor.

If the sensor is an optical sensor, for example, the light beam reflected towards it by the test sample is entirely within the processing chamber, which has the advantage that it does not have to pass through any porthole.

More generally, the same advantageously applies to any transmission of data between the test sample and the insertable portion of the sensor, regardless of whether the sensor is of an optical, electrical or mechanical nature.

Moreover, because the individual holder carrying the test sample also carries at least the insertable portion of the sensor, the insertable portion of the sensor is fixed relative to the test sample and the measurement can therefore be effected continuously, without being comparative.

This advantageously simplifies acquisition of the measurement result.

Moreover, the individual holder used in the invention is advantageously transposable from one processing chamber to another in the manner of any onboard system, which facilitates its implementation.

It can advantageously be more or less massive and compact, which renders it relatively insensitive to the vibration inherent to processing chambers, to the benefit of the accuracy and the quality of the measurements effected.

The individual holder is advantageously compatible with a vacuum, stable in temperature and in time, and non-destructive.

In summary, the invention advantageously provides a very highly sensitive method of monitoring the evolution of the internal stresses in the thin film to be controlled from the very first stages of growing the latter.

BRIEF DESCRIPTION OF THE DRAWINGS

FIGS. 3, 4 and 5 are views in axial section which, analogous to that of FIG. 2, each relate to a respective embodiment of the invention;

FIG. 6 is a view in axial section analogous to that of FIG. 2 for another embodiment;

DESCRIPTION OF THE PREFERRED EMBODIMENTS

The figures show, by way of example, the application of the invention to substrates 10 in the form of blanks to be trimmed to form spectacle lenses.

The overall aim is to deposit a thin film of any kind onto the substrate 10, for example an anti-reflection film.

Figure 1:
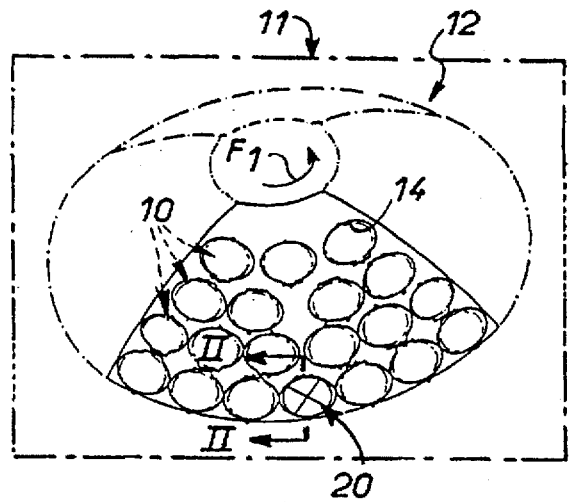
FIG. 1 is a perspective view to a relatively small scale of the collective holder that has to carry the substrates to be processed.

As shown diagrammatically in FIG. 1, there is used for this purpose, in a processing chamber 11, a collective holder 12 which, for practical reasons, is in the general shape of a spherical dome in the embodiment shown; rotatable in the processing chamber 11, as shown by the arrow F1 in FIG. 1, for example, it has a plurality of sites 14 (in practise circular contour openings) each adapted to receive a substrate 10.

As these arrangements are well known in themselves, in particular from U.S. Pat. No. 4,817,599 and from published French patent application 2 671 738, filed Jan. 22, 1991 as application number 91 00665, they will not be described in more detail here.

In a manner that is also known in itself, for example from U.S. Pat. No. 5,154,810, a device 15 is provided for in situ stress measurement in the thin film upon its deposition on the substrates 10; the device 15 uses a test sample 16 carried by the collective holder 12 and a sensor 18 which measures the deformation of the test sample 16.

In accordance with the invention, the test sample 16 is carried by an individual holder 20 adapted to be received into one of the sites 14 of the collective holder 12, instead of one of the substrates 10; it also carries the insertable portion 21 at least of the sensor 18.

Figure 2:
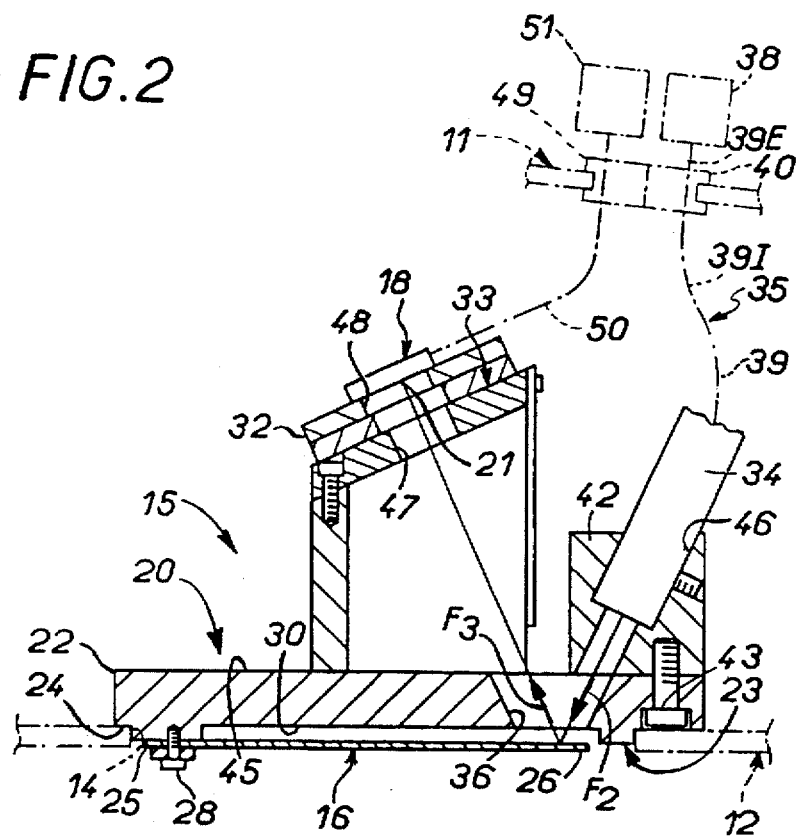
FIG. 2 is a view in axial section on the line II—II in FIG. 1 and to a larger scale of the individual holder to carry a test sample substituted by the invention for one of the substrates.
Figure 3:
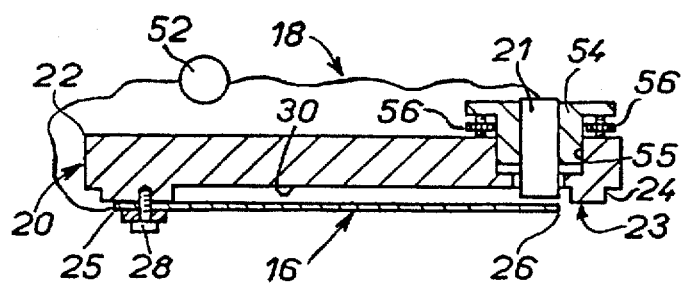

In the embodiments shown in FIGS. 2 through 4, the individual holder 20 includes a base 22 in the form of a relatively massive block which in practise is made of metal and has a circular contour. At the periphery of its bottom surface 23, which forms the bottom surface of the individual holder 20, it has an annular rebate 24 which nests in one of the sites 14 of the collective holder 12.

In these embodiments the test sample 16 is a blade member carried by the individual holder 20, facing its bottom surface 23, having one end 25 fixed to the individual holder 20 in the manner of a cantilever beam and the other end 26 free.

The blade member has a generally rectangular contour in plan view, for example.

In the embodiments shown it is attached by one or more screws 28 to the bottom surface 23 of the individual holder 20 at the fixed end 25 and when at rest, as shown, it extends substantially parallel to the bottom surface 23, within a recess 30 provided on the latter in corresponding relationship with it.

In the embodiment specifically shown in FIG. 2, the sensor 18 is an optical sensor, for example a PSD (Position Sensitive Detector) type displacement sensor.

The insertable portion 21 at least of the sensor 18 is carried by the individual holder 20 through the intermediary of a plate 32 forming an XY table.

In the embodiment shown, the sensor 18 is in practise entirely located within the processing chamber 11 and is therefore entirely carried by the individual holder 20 through the intermediary of the plate 32 forming an XY table.

The plate 32 is in practise itself carried by an inclined console 33 attached to the base 22.

The individual holder 20 also carries the end portion 34 at least of a light source 35 which, as shown diagrammatically by an arrow F2 in FIG. 2, directs a light beam onto the free end 26 of the blade member forming the test sample 16 through an opening 36 in the base 22 of the individual holder 20.

In the embodiment specifically shown in FIG. 2, the light source 35 includes an emitter part 38 that is outside the processing chamber 11.

The end portion 34 of the light source 35 carried by the individual holder 20 is formed by the end of a conduction part 39 connecting the individual holder 20 to the emitter part 38, as shown diagrammatically in chain-dotted outline in FIG. 2.

The emitter part 38 is a neon laser, for example, and the conduction part 39 is formed by two successive sections 39E, 39I of an optical fiber, one external to the processing chamber 11 and the other inside it, butt-jointed by a sealed lead-through 40 providing a sealed connection between the inside and the outside of the processing chamber 11.

Because the collective holder 12 rotates, the sealed lead-through 40 is preferably on its rotation axis.

As the constructional details of the sealed lead-through 40 are not relevant to the present invention they will not be described in more detail here.

In the embodiments shown, the end portion 34 of the light source 35 is carried by a block 42 in turn attached, by one or more screws 43, for example, to the top surface 45 of the base 22 of the individual holder 20.

This end portion 34 is in practise inserted into a bore 46 in the block 42 which is inclined on the base 22 at an angle which is the complement of the angle the console makes with the base 22.

Thus the light beam reflected by the free end 26 of the blade member constituting the test sample 16 is directed towards the insertable portion 21 of the sensor 18 via the opening 36 in the base 22, as shown by the arrow F3 in FIG. 2.

An opening 47 in the console 33 and an opening 48 in the plate 32 forming the XY table are provided for the reflected light beam.

By means of a sealed lead-through 49, electrical conductors 50 connect the sensor 18 to an acquisition unit 51 outside the processing chamber 11, as shown diagrammatically in chain-dotted outline in FIG. 2.

The distribution of current along the sensor 18 in practise enables measurement of the position along the latter of the light spot produced by the light beam reflected from the blade member constituting the test sample 16.

The signal output by the acquisition unit 51 is in practise proportional to the displacement of this spot in this case.

Linked to the deflection of the blade member constituting the test sample 16, this displacement is itself proportional to the stresses in the thin film deposited onto the blade member.

The signal output by the acquisition unit 51 therefore in practise represents these internal stresses directly.

In various embodiments that are not shown there is provision for relative movement between the end portion 34 at least of the light source 35 and the sensor 18.

For example, the end portion 34 of the light source 35 is mounted to move in translation on the individual holder 20 so that the light beam issuing from it is scanned along the length of the blade member constituting the test sample 16.

As an alternative to this, there is provision for combined translational and rotational movement of the end portion 34.

In this case, the corresponding displacement is chosen so that the point of impact on the insertable portion 21 of the sensor 18 of the light beam reflected by the blade member constituting the test sample 16 is always in the same area.

For example, the end portion 34 of the light source 35 can move along a circular rail.

Alternatively, the end portion 34 can be at the end of a rotary arm.

In the embodiment shown in FIG. 3, the sensor 18 is an electrical sensor.

Its insertable portion 21 is in practise an electrode forming with the test sample 16 a differential capacitor, and it further includes a capacitance meter 52 connected between the electrode and the test sample 16.

Due to the effect of the deposit, the blade member constituting the test sample 16 becomes curved and this causes a small variation in the distance that separates it from the associated electrode.

This varies the corresponding capacitance and this variation, measured by the capacitance meter 52, depends on the deflection of the blade member constituting the test sample 16 and therefore on the stresses in the thin film deposited on the latter.

The electrode forming the insertable portion 21 of the sensor 18 is preferably adjustable in position on the individual holder 20 to adjust the distance initially separating it from the test sample 16.

In the embodiment shown, the individual holder 20 is in practise reduced to its base 22 and the electrode forming the insertable portion 21 of the sensor 18 is carried by a block 54 slidably engaged in a bore 55 in the base 22, perpendicular to the bottom surface 23 of the latter, with screw jacks 56 operative between the block 54 and the base 22.

In the embodiment shown in FIG. 3, the sensor 18 constitutes a kind of proximity sensor.

In an embodiment that is not shown, a proximity sensor of this kind is formed by an optical sensor including a bundle of fibers with their end portion disposed near the test sample 16, in a similar manner to the electrode previously mentioned.

Some of these fibers introduce light and the portion of this light reflected by the test sample is collected by the other fibers.

The deformation of the test sample 16 can be calculated by measuring the light losses between the incident and reflected beams.

In the embodiment shown in FIG. 4, the sensor 18 is a mechanical sensor.

Its insertable portion 21 is a feeler which is urged by spring means 58 into contact with the test sample 16.

The sensor 18 further includes a measurement head 59 sensitive to the force with which the insertable portion 21 is applied to the test sample 16.

In the embodiment shown, the insertable portion 21 is in practise at the end of an elastically deformable blade member which, carried by the measurement head 59, extends freely cantilever-fashion from the latter and itself constitutes the associated spring means 58.

As previously, the individual holder 20 is essentially reduced to its base 22.

The measurement head 59 is adjustable in position on the base 22, by means of screw jacks 60, which adjust its position to adjust the force with which the feeler forming the insertable portion 21 is initially applied to the test sample 16, to be more precise to the free end 26 of the blade member constituting the test sample 16.

This feeler tracks deformation of the test sample 16 and the measurement head 59 measures its displacement and therefore the deformation of the test sample 16.

In the embodiment shown in FIG. 5, the test sample 16 is a disk the periphery of which bears through gravity alone on a shoulder 62 of the individual holder 20.

The shoulder 62 is in practise annular, being part of a ring 63 screwed to the individual holder 20.

The test sample 16 is on the opposite side of a transparent calibration disk 64 to the end portion 34 of the light source 35. An oblique beam splitter 65 in the corresponding parallel incident light beam reflects a beam towards the insertable portion 21 of the sensor 18.

Some of the light is reflected by the transparent calibration disk 64 and the remainder by the test sample 16.

The images obtained are different sizes and the difference between their dimensions is used to calculate the radius of curvature of the test sample 16.

The sensor 18 can be a CCD matrix, for example.

Alternatively, the test sample 16 is a blade member, as previously, and the transparent calibration disk 64 can then be disposed alongside the test sample 16, rather than in front of it.

The parallel beam emitted by the end portion 34 of the light source 35 can be replaced by a narrow beam, in particular if the light source is a laser, so that the surface of the test sample 16 can be scanned by the light beam, as if the end portion 34 of the light source 35 were to be displaced accordingly but without any imperfections due to such displacement.

In the embodiment shown in FIG. 6, which is in fact a preferred embodiment, the light source 35 is reduced to its end portion 34, consisting of a laser diode, which is carried directly by the block 42 of the individual holder 20. By means of electrical conductors 70 passing through the same sealed lead-through 49 as the electrical conductors 50 connecting the sensor 18 to the acquisition unit 51, it is electrically connected to an electrical power supply 71 outside the processing chamber 11.

This embodiment therefore has the advantage of requiring only one sealed lead-through.

Figure 7:
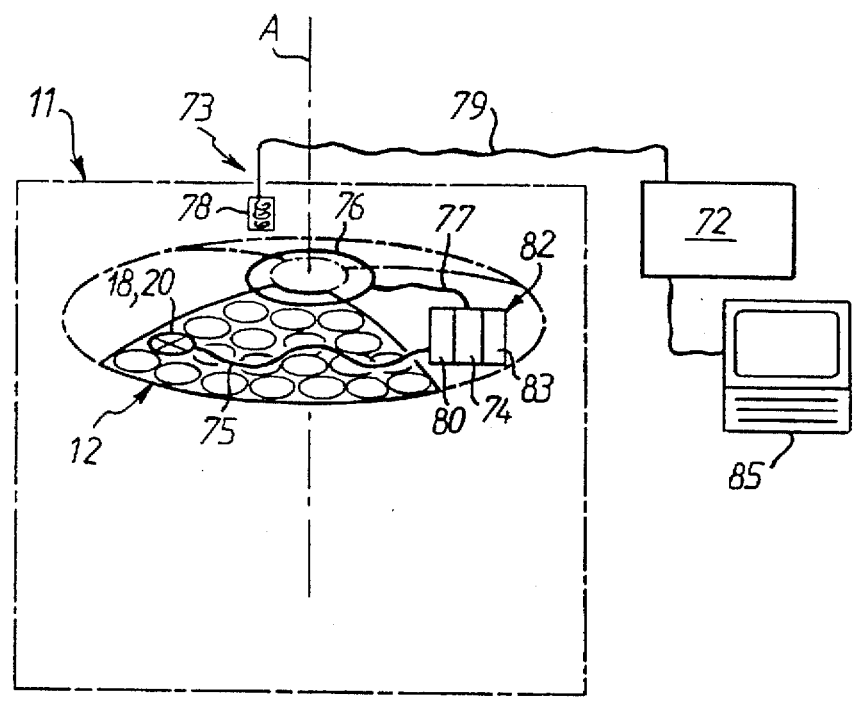
FIG. 7 is a diagrammatic perspective view analogous to that of FIG. 1 for a different embodiment of the transmission means for exploiting the measurement signals obtained.

In the embodiment shown diagrammatically in FIG. 7, the individual holder 20 carries all of the sensor 18 and a radio transmission system 73 is provided between the sensor 18 and a receiver 72 outside the processing chamber 11.

The radio transmission system 73 in practise includes a transmitter 74 carried by the collective holder 12 and to which the sensor 18 is connected by electrical conductors 75, a transmit antenna 76 also carried by the collective holder 12 and to which the transmitter 74 is connected by electrical conductors 77, and a receive antenna 78 carried by the processing chamber 11 and which is connected to the receiver 72 by electrical conductors 79 passing through the processing chamber 11 in a sealed manner.

Because the collective holder 12 rotates in the processing chamber 11 about an axis A shown diagrammatically in chain-dotted line in FIG. 7, the transmit antenna 76 is in practise a single electrical wire extending circumferentially around the rotation axis A, along a line of latitude of the collective holder 12, and the receive antenna 78 is disposed vertically above this line of latitude.

The receive antenna 78 therefore faces the circle traced out by the transmit antenna 76 as the collective holder 12 rotates.

The circular configuration of the transmit antenna 76 advantageously maintains a constant distance between itself and the receive antenna 78 as the collective holder 12 rotates, which guarantees the quality of the radio link.

The receive antenna 78 is a simple coil molded into a synthetic material body, for example.

It is in practise separated from the transmit antenna 76 by only some ten centimeters.

A processing unit 80 is preferably provided on the input side of the radio transmission system 73, between the sensor 18 and the transmitter 74. It is adapted to convert microcurrent(s) from the sensor 18 into a voltage.

The processor unit 80 and the transmitter 74 are in practise disposed in a common sealed housing 82 carried by the collective holder 12 and also containing batteries 83 supplying power to the system.

The batteries 83 can be charged without opening the sealed casing 82, via sealed electrical connections provided in the casing for this purpose and for the electrical conductors 75 and 77.

In operation, the batteries 83 supply power to the sensor 18, the processor unit 80 and the transmitter 74.

As shown in FIG. 7, the receiver 72 is connected to a recording device 85, if required.

In the telemetry system running from the sensor 18 to the recording device 85, the radio transmission system 73 and the receiver 72 are advantageously transparent.

The transmitter 74 receives a voltage and, after decoding the corresponding signal, the receiver 72 supplies the same voltage.

The system is advantageously not disturbed by various sources of electromagnetic radiation that may be present in the processing chamber 11, such as electron guns used to obtain the source of the deposit and/or plasma ion sources.

The present invention is naturally not limited to the embodiments described and shown, but encompasses any variant execution and/or combination of the various parts thereof.

There is claimed:

1. In a method for the deposition of a thin film on substrates in a processing chamber, the substrates being supported on a rotatable collective holder having a plurality of sites therefor and the thin film being deposited in the course of rotation of the collective holder, further comprising the steps of: providing an individual holder for carrying a test sample at one of the plurality of sites on the collective holder, and at least part of a sensor adapted to measure deformation of the test sample; and measuring with the sensor deformation of the thin film deposited on the test sample so as to determine the stress within the film deposited on the test sample and thereby the stress within the film deposited on the substrates.

2. Device for in situ determination of the stresses within a thin film deposited on substrates in the course of deposition inside a processing chamber, the device comprising a rotatable collective holder having a plurality of sites for receiving substrates for the deposition of thin film thereon, said rotatable collective holder having a site receiving an individual holder for carrying a test sample on which the thin film is also adapted to be deposited, and said individual holder carrying at least part of a sensor for measuring deformation of the test sample in situ.

3. Device according to claim 2 wherein said sensor is an optical sensor.

4. Device according to claim 3 wherein said individual holder also carries an output portion of a light source for directing a light beam on to the test sample, and said optical sensor is disposed on said at least part of said sensor for detecting displacement of the light beam reflected by the test sample.

5. Device according to claim 4 wherein said light source has an emitter part located outside said processing chamber, said light source output portion comprising a transmission portion connecting said emitter part to said individual holder.

6. Device according to claim 4 wherein the entire said light source is carried by said individual holder, electrical conductor connecting said light source to an electrical power supply disposed outside said processing chamber.

7. Device according to claim 2, wherein said sensor is an electrical sensor.

8. Device according to claim 7 wherein said at least part of said sensor comprises an electrode, said electrode defining with said test sample a differential capacitor, said sensor further comprising capacitance measuring means connected between said electrodes and said test sample.

9. Device according to claim 8 wherein said electrode is adjustably mounted in position on said individual holder for adjusting the distance between said electrode and said test sample.

10. Device according to claim 2 wherein said sensor is a mechanical sensor.

11. Device according to claim 10 wherein said at least part of said sensor comprises a feeler spring-biased against said test sample, said sensor further comprising a measurement head responsive to force applied by said at least part of said sensor to said test sample.

12. Device according to claim 11 wherein said at least part of said sensor is disposed at an end of an elastically deformable blade member carried by said measurement head.

13. Device according to claim 2 wherein said measurement head is adjustably mounted in position on said individual holder for adjusting initial force applied by said at least part of said sensor to said test sample.

14. Device according to claim 2 wherein an XY table carries said at least part of said sensor on said individual holder.

15. Device according to claim 2 wherein the entire said sensor is disposed inside said processing chamber and carried by said individual holder.

16. Device according to claim 2 wherein said test sample comprises a blade member rigidly attached cantilever-fashion at one end to said individual holder and having a free end remote therefrom.

17. Device according to claim 2 wherein said test sample comprises a disk, said individual holder including a shoulder, said disk bearing through gravity alone on said shoulder.

18. Device according to claim 2 wherein said individual holder has a bottom surface, said test sample being disposed below said bottom surface.

19. Device according to claim 2 wherein the entire said sensor is carried by said individual holder, radio transmission means being provided between said sensor and a receiver disposed outside said processing chamber.

20. Device according to claim 19 wherein said radio transmission means includes a transmitter carried by said collective holder, electrical conductors connecting said transmitter to said sensor, a transmit antenna also carried by said collective holder, electrical conductors also connecting said transmit antenna to said transmitter, a receive antenna carried by said processing chamber, electrical conductors connecting said receive antenna to said receiver, the last mentioned electrical conductors extending sealingly through said processing chamber.

21. Device according to claim 19 wherein said transmit antenna is defined by an electrical wire extending circumferentially around a rotation axis of said collective holder and along a great circle thereon, said receive antenna being disposed above said great circle.

22. Device according to claim 19 wherein a processor unit is provided on an input side of said radio transmission means for converting microcurrent(s) of said sensor into a voltage.

23. Device according to claim 22 wherein said processing unit and said transmitter are both disposed in a common sealed casing carried by said collective holder.

24. Device according to claim 22 wherein said sealed casing also contains batteries for supplying power to said radio transmission means.

* * * * *